US012777975B2

(12) United States Patent
Uzoh et al.

(10) Patent No.: US 12,777,975 B2
(45) Date of Patent: Oct. 27, 2026

(54) LOW TEMPERATURE DIRECT BONDING

(71) Applicant: ADEIA SEMICONDUCTOR BONDING TECHNOLOGIES INC., San Jose, CA (US)

(72) Inventors: Cyprian Emeka Uzoh, San Jose, CA (US); Jeremy Alfred Theil, Mountain View, CA (US); Thomas Workman, San Jose, CA (US); Belgacem Haba, Saratoga, CA (US)

(73) Assignee: Adeia Semiconductor Bonding Technologies Inc., San Jose, CA (US)

(*) Notice: Subject to any disclaimer, the term of this patent is extended or adjusted under 35 U.S.C. 154(b) by 554 days.

(21) Appl. No.: 18/312,949

(22) Filed: May 5, 2023

(65) Prior Publication Data

US 2023/0361074 A1 Nov. 9, 2023

Related U.S. Application Data

(60) Provisional application No. 63/338,692, filed on May 5, 2022.

(51) Int. Cl.
*H10W 90/00* (2026.01)
*H10W 72/00* (2026.01)
(Continued)

(52) U.S. Cl.
CPC ............ *H10W 90/00* (2026.01); *H10W 72/01* (2026.01); *H10W 72/01951* (2026.01);
(Continued)

(58) Field of Classification Search
None
See application file for complete search history.

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

CN 101688297 A * 3/2010 ......... H10F 71/1224
CN 111834355 A * 10/2020 ............. H01L 24/97
(Continued)

OTHER PUBLICATIONS

Brandt et al., "Stress-Assisted Thermal Diffusion Barrier Breakdown in Ion Beam Deposited Cu/W Nano-Multilayers of Si Substrate Observed by In Situ GISAXS and Transmission EDX," ACS Appl. Mater. Interfaces, 2021, vol. 13, pp. 6795-6804.
(Continued)

*Primary Examiner* — Michael Lebentritt
(74) *Attorney, Agent, or Firm* — Knobbe, Martens, Olson & Bear, LLP

(57) ABSTRACT

A method for forming a bonded structure is disclosed. The method can include providing a first element having a first non-conductive region and a first conductive feature, providing a second element having a second non-conductive region and a second conductive feature, bonding the first non-conductive region to the second non-conductive region, and imparting mechanical stress to at least one of the first conductive feature and the second conductive feature. When bonding the first non-conductive region to the second non-conductive region, the first conductive feature and the second conductive feature are spaced apart by a gap. Imparting mechanical stress to the at least one of the first conductive feature and the second conductive feature reduces the gap between the first and second conductive features. The method can include annealing the first and second elements while imparting the mechanical stress to the at least one of
(Continued)

the first conductive feature and the second conductive feature.

20 Claims, 16 Drawing Sheets

(51) Int. Cl.
*H10W 72/90* (2026.01)
*H10W 80/00* (2026.01)
*H10W 90/24* (2026.01)
*H10W 90/26* (2026.01)

(52) U.S. Cl.
CPC ...... *H10W 72/0198* (2026.01); *H10W 72/934* (2026.01); *H10W 72/9415* (2026.01); *H10W 80/102* (2026.01); *H10W 80/312* (2026.01); *H10W 80/327* (2026.01); *H10W 80/334* (2026.01); *H10W 80/701* (2026.01); *H10W 80/743* (2026.01); *H10W 90/24* (2026.01); *H10W 90/26* (2026.01); *H10W 90/792* (2026.01)

(56) References Cited

U.S. PATENT DOCUMENTS 6,080,640 A 6/2000 Gardner et al.
6,423,640 B1 7/2002 Lee et al.
6,465,892 B1 10/2002 Suga
6,887,769 B2 5/2005 Kellar et al.
6,908,027 B2 6/2005 Tolchinsky et al.
7,045,453 B2 5/2006 Canaperi et al.
7,105,980 B2 9/2006 Abbott et al.
7,193,423 B1 3/2007 Dalton et al.
7,750,488 B2 7/2010 Patti et al.
7,803,693 B2 9/2010 Trezza
8,183,127 B2 5/2012 Patti et al.
8,278,142 B2 * 10/2012 Takahashi ............... H01L 24/92 438/106
8,349,635 B1 1/2013 Gan et al.
8,377,798 B2 2/2013 Peng et al.
8,441,131 B2 5/2013 Ryan
8,476,165 B2 7/2013 Trickett et al.
8,482,132 B2 7/2013 Yang et al.
8,501,537 B2 8/2013 Sadaka et al.
8,524,533 B2 9/2013 Tong et al.
8,620,164 B2 12/2013 Heck et al.
8,647,987 B2 2/2014 Yang et al.
8,697,493 B2 4/2014 Sadaka
8,716,105 B2 5/2014 Sadaka et al.
8,802,538 B1 8/2014 Liu
8,809,123 B2 8/2014 Liu et al.
8,841,002 B2 9/2014 Tong
9,093,350 B2 7/2015 Endo et al.
9,142,517 B2 9/2015 Liu et al.
9,171,756 B2 10/2015 Enquist et al.
9,184,125 B2 11/2015 Enquist et al.
9,224,704 B2 12/2015 Landru
9,230,941 B2 1/2016 Chen et al.
9,257,399 B2 2/2016 Kuang et al.
9,299,736 B2 3/2016 Chen et al.
9,312,229 B2 4/2016 Chen et al.
9,331,149 B2 5/2016 Tong et al.
9,337,235 B2 5/2016 Chen et al.
9,385,024 B2 7/2016 Tong et al.
9,394,161 B2 7/2016 Cheng et al.
9,431,368 B2 8/2016 Enquist et al.
9,437,572 B2 9/2016 Chen et al.
9,443,796 B2 9/2016 Chou et al.
9,461,007 B2 10/2016 Chun et al.
9,496,239 B1 11/2016 Edelstein et al.
9,536,848 B2 1/2017 England et al.
9,559,081 B1 1/2017 Lai et al.
9,620,481 B2 4/2017 Edelstein et al.
9,656,852 B2 5/2017 Cheng et al.
9,723,716 B2 8/2017 Meinhold
9,728,521 B2 8/2017 Tsai et al.
9,741,620 B2 8/2017 Uzoh et al.
9,799,587 B2 10/2017 Fujii et al.
9,852,988 B2 12/2017 Enquist et al.
9,893,004 B2 2/2018 Yazdani
9,899,442 B2 2/2018 Katkar
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.
10,026,605 B2 7/2018 Doub et al.
10,075,657 B2 9/2018 Fahim et al.
10,204,893 B2 2/2019 Uzoh et al.
10,269,756 B2 4/2019 Uzoh
10,276,619 B2 4/2019 Kao et al.
10,276,909 B2 4/2019 Huang et al.
10,418,277 B2 9/2019 Cheng et al.
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,707,087 B2 7/2020 Uzoh et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,037,919 B2 6/2021 Uzoh et al.
11,056,348 B2 7/2021 Theil
11,069,734 B2 7/2021 Katkar
11,088,099 B2 8/2021 Katkar et al.
11,127,738 B2 9/2021 DeLaCruz et al.
11,158,573 B2 10/2021 Uzoh et al.
11,158,606 B2 10/2021 Gao et al.
11,169,326 B2 11/2021 Huang et al.
11,171,117 B2 11/2021 Gao et al.
11,176,450 B2 11/2021 Teig et al.
11,189,585 B2 * 11/2021 Mueller .................. H01L 24/08
11,195,748 B2 12/2021 Uzoh et al.
11,205,625 B2 12/2021 DeLaCruz et al.
11,244,920 B2 2/2022 Uzoh
11,256,004 B2 2/2022 Haba et al.
11,264,357 B1 3/2022 DeLaCruz et al.
11,276,676 B2 3/2022 Enquist et al.
11,296,044 B2 4/2022 Gao et al.
11,296,053 B2 4/2022 Uzoh et al.
11,329,034 B2 5/2022 Tao et al.
11,348,898 B2 5/2022 DeLaCruz et al.
11,355,404 B2 6/2022 Gao et al.
11,355,443 B2 6/2022 Huang et al.
11,367,652 B2 6/2022 Uzoh et al.
11,373,963 B2 6/2022 DeLaCruz et al.
11,380,597 B2 7/2022 Katkar et al.
11,385,278 B2 7/2022 DeLaCruz et al.
11,387,202 B2 7/2022 Haba et al.
11,387,214 B2 7/2022 Wang et al.
11,393,779 B2 7/2022 Gao et al.
11,462,419 B2 10/2022 Haba
11,476,213 B2 10/2022 Haba et al.
11,515,291 B2 11/2022 DeLaCruz et al.

(56) References Cited

U.S. PATENT DOCUMENTS

| | | | |
|---|---|---|---|
| 11,626,363 | B2 | 4/2023 | Haba et al. |
| 11,631,647 | B2 | 4/2023 | Haba |
| 2004/0084414 | A1 | 5/2004 | Sakai et al. |
| 2006/0057945 | A1 | 3/2006 | Hsu et al. |
| 2007/0111386 | A1 | 5/2007 | Kim et al. |
| 2012/0009766 | A1* | 1/2012 | Adam .................. H10D 30/751 438/479 |
| 2014/0175655 | A1 | 6/2014 | Chen et al. |
| 2014/0256087 | A1 | 9/2014 | Liu et al. |
| 2015/0064498 | A1 | 3/2015 | Tong |
| 2015/0380383 | A1 | 12/2015 | Gondcharton et al. |
| 2016/0343682 | A1 | 11/2016 | Kawasaki |
| 2018/0175012 | A1 | 6/2018 | Wu et al. |
| 2018/0182639 | A1 | 6/2018 | Uzoh et al. |
| 2018/0182666 | A1 | 6/2018 | Uzoh et al. |
| 2018/0190583 | A1 | 7/2018 | DeLaCruz et al. |
| 2018/0219038 | A1 | 8/2018 | Gambino et al. |
| 2018/0323177 | A1 | 11/2018 | Yu et al. |
| 2018/0323227 | A1 | 11/2018 | Zhang et al. |
| 2018/0331066 | A1 | 11/2018 | Uzoh et al. |
| 2019/0115277 | A1 | 4/2019 | Yu et al. |
| 2019/0131277 | A1 | 5/2019 | Yang et al. |
| 2019/0319007 | A1 | 10/2019 | Uzoh et al. |
| 2019/0385935 | A1 | 12/2019 | Gao et al. |
| 2020/0013765 | A1 | 1/2020 | Fountain, Jr. et al. |
| 2020/0035641 | A1 | 1/2020 | Fountain, Jr. et al. |
| 2020/0075533 | A1* | 3/2020 | Gao ........................ H01L 24/80 |
| 2020/0194396 | A1 | 6/2020 | Uzoh |
| 2020/0294908 | A1 | 9/2020 | Haba et al. |
| 2020/0328162 | A1 | 10/2020 | Haba et al. |
| 2020/0395321 | A1 | 12/2020 | Katkar et al. |
| 2021/0098412 | A1 | 4/2021 | Haba et al. |
| 2021/0118864 | A1 | 4/2021 | DeLaCruz et al. |
| 2021/0143125 | A1 | 5/2021 | DeLaCruz et al. |
| 2021/0181510 | A1 | 6/2021 | Katkar et al. |
| 2021/0193603 | A1 | 6/2021 | DeLaCruz et al. |
| 2021/0193624 | A1 | 6/2021 | DeLaCruz et al. |
| 2021/0193625 | A1* | 6/2021 | Katkar ................ H01L 25/0657 |
| 2021/0242152 | A1* | 8/2021 | Fountain, Jr. ........... H01L 24/80 |
| 2021/0296282 | A1* | 9/2021 | Gao ........................ H01L 24/08 |
| 2021/0305202 | A1 | 9/2021 | Uzoh et al. |
| 2021/0366820 | A1 | 11/2021 | Uzoh |
| 2022/0077063 | A1 | 3/2022 | Haba |
| 2022/0077087 | A1 | 3/2022 | Haba |
| 2022/0139867 | A1 | 5/2022 | Uzoh |
| 2022/0139869 | A1 | 5/2022 | Gao et al. |
| 2022/0208650 | A1 | 6/2022 | Gao et al. |
| 2022/0208702 | A1 | 6/2022 | Uzoh |
| 2022/0208723 | A1 | 6/2022 | Katkar et al. |
| 2022/0246497 | A1 | 8/2022 | Fountain, Jr. et al. |
| 2022/0285303 | A1 | 9/2022 | Mirkarimi et al. |
| 2022/0319901 | A1 | 10/2022 | Suwito et al. |
| 2022/0320035 | A1 | 10/2022 | Uzoh et al. |
| 2022/0320036 | A1 | 10/2022 | Gao et al. |
| 2023/0005850 | A1 | 1/2023 | Fountain, Jr. |
| 2023/0019869 | A1 | 1/2023 | Mirkarimi et al. |
| 2023/0020037 | A1* | 1/2023 | Hsu ..................... H01L 25/0657 |
| 2023/0036441 | A1 | 2/2023 | Haba et al. |
| 2023/0067677 | A1 | 3/2023 | Lee et al. |
| 2023/0069183 | A1 | 3/2023 | Haba |
| 2023/0100032 | A1 | 3/2023 | Haba et al. |
| 2023/0115122 | A1 | 4/2023 | Uzoh et al. |
| 2023/0122531 | A1 | 4/2023 | Uzoh |
| 2023/0123423 | A1 | 4/2023 | Gao et al. |
| 2023/0125395 | A1 | 4/2023 | Gao et al. |
| 2023/0130259 | A1 | 4/2023 | Haba et al. |
| 2023/0132632 | A1 | 5/2023 | Katkar et al. |
| 2023/0140107 | A1 | 5/2023 | Uzoh et al. |
| 2023/0142680 | A1 | 5/2023 | Guevara et al. |
| 2023/0154816 | A1 | 5/2023 | Haba et al. |
| 2023/0154828 | A1 | 5/2023 | Haba et al. |
| 2023/0187264 | A1 | 6/2023 | Uzoh et al. |
| 2023/0187317 | A1 | 6/2023 | Uzoh |
| 2023/0187412 | A1 | 6/2023 | Gao et al. |
| 2023/0197453 | A1 | 6/2023 | Fountain, Jr. et al. |
| 2023/0197496 | A1 | 6/2023 | Theil |
| 2023/0197559 | A1 | 6/2023 | Haba et al. |
| 2023/0197560 | A1 | 6/2023 | Katkar et al. |
| 2023/0197655 | A1 | 6/2023 | Theil et al. |
| 2023/0207402 | A1 | 6/2023 | Fountain, Jr. et al. |
| 2023/0207437 | A1 | 6/2023 | Haba |
| 2023/0207474 | A1 | 6/2023 | Uzoh et al. |
| 2023/0207514 | A1 | 6/2023 | Gao et al. |
| 2023/0215836 | A1 | 7/2023 | Haba et al. |
| 2023/0245950 | A1 | 8/2023 | Haba et al. |
| 2023/0268300 | A1 | 8/2023 | Uzoh et al. |

FOREIGN PATENT DOCUMENTS

| | | | | |
|---|---|---|---|---|
| CN | 112599483 | A | 4/2021 | |
| EP | 0379965 | A1 | 8/1990 | |
| JP | 2013-033786 | A | 2/2013 | |
| JP | 2018-160519 | | 10/2018 | |
| JP | 6448848 | B2 | 1/2019 | |
| JP | 7246136 | B2 * | 3/2023 | ............ H10F 39/811 |
| KR | 10-2015-0088691 | | 8/2015 | |
| TW | 201542442 | A1 | 11/2015 | |
| TW | I712074 | B | 12/2020 | |
| WO | WO 2005/043584 | A2 | 5/2005 | |
| WO | WO 2014/049414 | A1 | 4/2014 | |
| WO | WO-2020163984 | A1 * | 8/2020 | ....... H01L 23/53257 |
| WO | WO-2021075036 | A1 * | 4/2021 | ............. H01L 25/16 |

OTHER PUBLICATIONS

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Ker, Ming-Dou et al., "Fully process-compatible layout design on bond pad to improve wire bond reliability in CMOS lcs," IEEE Transactions on Components and Packaging Technologies, Jun. 2002, vol. 25, No. 2, pp. 309-316.

International Search Report and Written Opinion mailed Aug. 28, 2023 in International Application No. PCT/US2023/021222, 9 pages.

Moriceau, H. et al., "Overview of recent direct wafer bonding advances and applications," Advances in Natural Sciences-Nanoscience and Nanotechnology, 2010, 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, Electronics Weekly.com ("BUSH article"); however, the imaged part and the part shown in the BUSH article share the part number "ONSEMI AR0820."

Plobi, A. et al., "Wafer direct bonding: tailoring adhesion between brittle materials," Materials Science and Engineering Review Journal, 1999, R25, 88 pages.

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung

(56) References Cited

OTHER PUBLICATIONS

Galaxy S7; however the imaged part and the part shown in the Morrison et al. article share the part name "Sony IMX260."
Zhao et al., "Deformation-assisted diffusion for the enhanced kinetecs of dynamic phase transformation," https://doi.org/10.1080/21663831.2018.1527787, 2018.
International Preliminary Report on Patentability issued Oct. 29, 2024, in International Application No. PCT/US2023/021222, 5 pages.

* cited by examiner

LOW TEMPERATURE DIRECT BONDING

CROSS-REFERENCE TO RELATED APPLICATIONS

This application claims priority to U.S. Provisional Patent Application No. 63/338,692, filed May 5, 2022, the entire contents of which are hereby incorporated by reference herein in their entirety and for all purposes.

BACKGROUND

Field

The field relates to structures and methods for direct bonding, and in particular to methods for hybrid direct bonding of elements (e.g., semiconductor elements) at low temperature.

Description of the Related Art

Semiconductor elements, such as integrated device dies or chips, may be mounted or stacked on other elements. For example, a semiconductor element can be mounted to a carrier, such as an integrated device die, an interposer, a reconstituted wafer or element, etc. As another example, a semiconductor element can be stacked on top of another semiconductor element, e.g., a first integrated device die can be stacked on a second integrated device die. Each of the semiconductor elements can have conductive pads for mechanically and electrically bonding the semiconductor elements to one another.

There are many advantages to directly bonding elements together, without intervening adhesives, such as solder. However, direct hybrid bonding of both conductive features and nonconductive field regions can be challenging. Accordingly, there is a continuing need for improved methods for hybrid direct bonding.

DETAILED DESCRIPTION

Figure 1A:
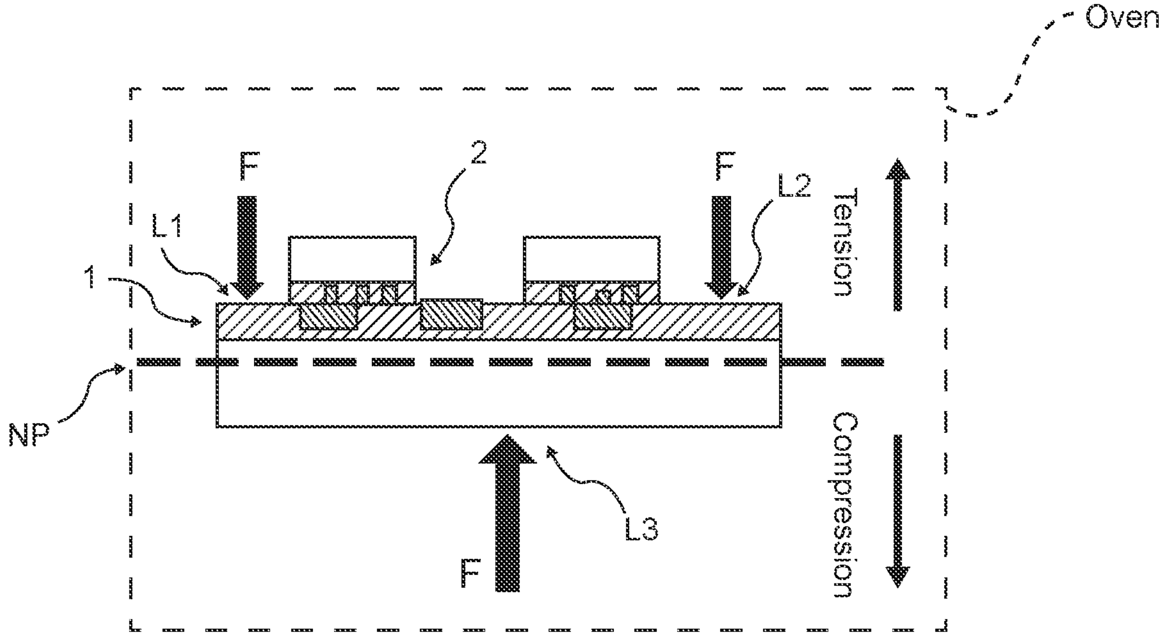
FIG. 1A is a schematic cross-sectional side view of a structure that includes a first element and a second element in a step of a method of forming a bonded structure, according to an embodiment.
Figure 1B:
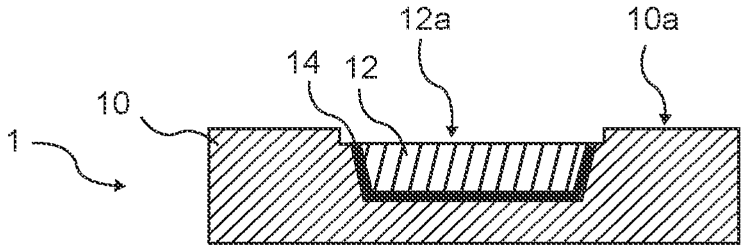
FIGS. 1B-1E show steps of forming the structure of FIG. 1A.

The present disclosure describes methods of direct bonding (e.g., hybrid direct bonding) elements (e.g., semiconductor elements) to one another at a relatively low temperature. The resulting bonded structures can comprise bonded conductive features with anomalous grain sizes that include a relatively small grain size and a relatively large grain size that is at least three times larger than the small grain size. For example, the large grain size can be at least three times, four times, or five times larger than the small grain size. The bonded conductive features of the resulting bonded structures can comprise a curved bonding interface. Two or more semiconductor elements (such as integrated device dies, wafers, etc.) may be stacked on or bonded to one another to form a bonded structure. Conductive contact pads of one element may be electrically connected to corresponding conductive contact pads of another element. Any suitable number of elements can be stacked in the bonded structure. The methods and bond pad structures described herein can be useful in other contexts, as well.

In some embodiments, the elements are directly bonded (e.g., hybrid bonded) to one another without an adhesive. In various embodiments, a non-conductive (e.g., semiconductor or inorganic dielectric) material of a first element can be directly bonded to a corresponding non-conductive (e.g., semiconductor or inorganic dielectric) field region of a second element without an adhesive. In various embodiments, a conductive region (e.g., a metal pad) of the first element can be directly bonded to a corresponding conductive region (e.g., a metal pad, a trench, or a via, such as a through substrate via (TSV)) of the second element without an adhesive. The non-conductive material can be referred to as a nonconductive bonding region or bonding layer of the first element. In some embodiments, the non-conductive material of the first element can be directly bonded to the corresponding non-conductive material of the second element using bonding techniques without an adhesive using the direct bonding techniques disclosed at least in U.S. Pat. Nos. 9,564,414; 9,391,143; and 10,434,749, the entire contents of each of which are incorporated by reference herein in their entirety and for all purposes. In other applications, in a bonded structure, a non-conductive material of a first element can be directly bonded to a conductive material of a second element, such that a conductive material of the first element is intimately mated with a non-conductive material of the second element. Suitable dielectric materials for direct bonding include but are not limited to inorganic dielectrics, such as silicon oxide, silicon nitride, or silicon oxynitride, or can include carbon, such as silicon carbide, silicon oxycarbonitride, silicon carbonitride or diamond-like carbon. Such carbon-containing ceramic materials can be considered inorganic, despite the inclusion of carbon. Additional examples of hybrid direct bonding may be found throughout U.S. Pat. No. 11,056,390, the entire contents of which are incorporated by reference herein in their entirety and for all purposes.

In various embodiments, direct bonds can be formed without an intervening adhesive. For example, semiconductor or dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two non-conductive materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contacts pads of the first element can also be directly bonded to corresponding conductive contacts of the second element. For example, a direct hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes. The bond structures described herein can also be useful for direct metal bonding without non-conductive region bonding, or for other bonding techniques.

In some embodiments, inorganic dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 30 nm, less than 20 nm, less than 15 nm, or less than 10 nm, for example, recessed in a range of 2 nm to 20 nm, or in a range of 2 nm to 10 nm. The nonconductive bonding regions can be directly bonded to one another without an adhesive at room temperature in some embodiments and, subsequently, the bonded structure can be annealed. Upon annealing, the contact pads can expand with respect to the nonconductive bonding regions and contact one another to form a metal-to-metal direct bond. The bonded structure can be annealed at an anneal temperature over 250° C. For example, the anneal temperature can be over 300° C. or 350° C. The anneal temperature can be determined based at least in part on the material of the conductive contact pads, coefficient of thermal expansion (CTE) mismatch between the conductive contact pads and the nonconductive bonding regions, the gap between the conductive contact pads. Beneficially, the use of surface to surface direct bonding techniques without adhesive, such as ZIBOND®, and/or the use of hybrid bonding techniques, such as Direct Bond Interconnect, or DBI®, available commercially from Adeia of San Jose, CA, can enable high density of pads connected across the direct bond interface (e.g., small or fine pitches for regular arrays). In various embodiments, the contact pads can comprise copper, although other metals may be suitable.

Thus, in direct bonding (e.g., hybrid bonding) processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In some embodiments, the bond interface can comprise a nitrogen-terminated inorganic non-conductive material, such as nitrogen-terminated silicon, silicon oxide, silicon nitride, silicon oxynitride, silicon carbide, silicon oxycarbide, silicon oxycarbonitride, etc. Thus, the surface of the bonding layer can comprise silicon nitride, silicon oxynitride, silicon oxycarbonitride, or silicon carbonitride, with higher levels of nitrogen present at the bonding interface compared to the bulk material below the interface, that are indicative of nitrogen termination of at least one of the elements prior to direct bonding. Other than nitrogen-containing dielectrics, the nitrogen content of the non-conductive material typically has a gradient peaking at or near the surface. In some embodiments, nitrogen and nitrogen related moieties may not be present at the bonding interface. As explained herein, the direct bond can comprise a covalent bond, which is stronger than van Der Waals bonds. The bonding layers can also comprise polished surfaces that are planarized to a high degree of smoothness.

As described above, the bonded structure can be annealed to expand the contact pads with respect to the nonconductive bonding regions and to form a metal-to-metal direct bond. Various embodiments disclosed herein relate to methods of forming the metal-to-metal direct bond with a relatively low anneal temperature. In some embodiments, the methods disclosed herein enables sufficient metal-to-metal direct bond at an anneal temperature of less than 250° C., less than 200° C., or less than 150° C. For example, the anneal temperature can be in a range of 100° C. to 250° C., 100° C. to 200° C., 100° C. to 150° C., 125° C. to 250° C., or 125° C. to 200° C. Such low temperature anneal can beneficially lower the thermal budget for direct bonding processes. In various embodiments, the low temperature anneal can be performed while inducing stress in the contact pads so as to increase an amount of expansion of the pads thereby assisting or accelerating the bonding. It should be appreciated that, as used herein, contact pads may include any suitable type of conductive feature of an element that is configured to electrically bond or connect to another element. For example, contact pads can include conductive features such as discrete metallic terminals connected to underlying circuitry by way of traces and/or vias. Contact pads can also refer to exposed conductive features at end(s) of through substrate vias (TSVs), e.g., in embodiments in which the exposed TSV ends of one element may be directly bonded to conductive features in another element.

In accordance with various embodiments, a method for forming a bonded structure can include providing a first element that has a first non-conductive region and a first conductive feature, and providing a second element that has a second non-conductive region and a second conductive feature.

The method can also include bonding the first non-conductive region to the second non-conductive region. The first non-conductive region can be directly bonded to the second non-conductive region without an intervening adhesive. A bonding surface of the first non-conductive region and a bonding surface of the second non-conductive region can be prepared for direct bonding. For example, the surfaces can be polished to a root-mean-square (rms) surface roughness of less than 2 nm. For example, the roughness of the bonding surfaces can be in a range of about 0.1 Å rms to 15 Å rms, 0.5 Å rms to 10 Å rms, or 1 Å rms to 5 Å rms. The roughness of the polished bonding surfaces can be slightly rougher (e.g., about 1 Å rms to 30 Å rms, 3 Å rms to 20 Å rms, or possibly rougher) after an activation process.

The method can also include bonding the first conductive feature to the second conductive feature. The first conductive feature can be directly bonded to the second conductive feature without an intervening adhesive. In some embodiments, the first conductive feature and the second conductive feature are not in contact with each other and spaced apart by a gap after the first non-conductive region is bonded to the second non-conductive region and before bonding the first conductive feature to the second conductive feature.

The bonding the first conductive feature to the second conductive feature can include applying, imparting, or inducing mechanical stress in the first conductive feature, the second conductive feature, the first non-conductive region, and/or the second non-conductive region. The bonding the first conductive feature to the second conductive feature can include annealing the first conductive feature and the second conductive feature under stress. The imparting the stress to the first conductive feature and/or the second conductive feature, and the annealing the first conductive feature and the second conductive feature can take place at the same time. The stress imparted to the first conductive feature and/or the second conductive feature can be in a range of 20 MPa to 1 GPa, 350 MPa to 1 GPa, 20 MPa to 500 MPa, 50 MPa to 400 MPa, 50 MPa to 100 MPa, 100 MPa to 250 MPa, 100 MPa to 350 MPa, 150 MPa to 300 MPa, or 175 MPa to 275 MPa. The imparted stress should be adequate to enhancing the bonding of the first and the second conductive features without incorporating unwanted defects in the bonded element. The unwanted defects may include cracks, delamination, crushing, or chipping of a part of an element. In some embodiments, the imparting the stress to the first conductive feature and/or the second conductive feature can make the distance between the first conductive feature and the second conductive feature closer than before imparting the stress. In some embodiments, the imparting the stress to the first conductive feature and/or the second conductive can enhance surface mobility of the first conductive feature and/or the second conductive feature thereby increasing diffusivity. The stress can be a tensile stress or a compression stress or hydrostatic. The bonding processes can take place at a wafer level or a die level (before or after singulation).

In some embodiments, after bonding the first element to the second element, and annealing the bonded elements under stress, the bonded conductive features can have anomalous grain sizes. The grain size distribution can be relatively broad. For example, the large grain size can be at least three times, four times, or five times larger than the small grain size.

In some embodiments, the tensile and/or compression stress induced on the first conductive feature and/or the second conductive feature can move a free surface (reducing the gap or recess between the opposing conductive features of the respective elements) of the first conductive feature and/or the second conductive feature, which can reduce the temperature for causing sufficient thermal expansion for bonding. The stress can raise the potential energy of the first conductive feature and/or the second conductive feature. The stress can raise the creep rate of the first conductive feature and/or the second conductive feature. The higher creep rate can contribute to higher propensity for bonding compared to a lower creep rate.

In accordance with various embodiments, a bonded structure can include a first element that has a first non-conductive region and a first conductive feature, and a second element that has a second non-conductive region and a second conductive feature. The first non-conductive region and the second non-conductive region can be bonded to one another, and the first conductive feature and the second conductive feature can be bonded to one another. The first non-conductive region and the second non-conductive region can be directly bonded to one another without an intervening adhesive, and the first conductive feature and the second conductive feature can be directly bonded to one another without an intervening adhesive. In some embodiments, a bonding interface between the first conductive feature and the second conductive feature can be deformed over a concave or convex mold or structure. Accordingly, the bonding interface can have a curved shape during the bonding process for bonding the first conductive feature and the second conductive feature. Depending on a thickness of the bonded elements, the curved shape of the bonding interface can have a middle ordinate, sagitta, or maximum deformation of about 10 μm to 5000 μm. For example, an element of a bonded elements having a thickness of about 800 μm may be deformed over a mold, such that the sagitta of the bonded interface is about 30 μm to 100 μm. For another example, an element of a bonded elements having a thickness of about 100 μm to 200 μm may be deformed over a mold such that the sagitta of the bonded interface may range between 1000 μm to 2000 μm.

In some embodiments, the grains of the first conductive feature and/or the second conductive feature can have anomalous grain sizes. For example, grain sizes of the first conductive feature at the bonding interface can be larger than grain sizes of the first conductive feature at a location farther away from the bonding interface. For example, grain sizes of the second conductive feature at a bonding interface can be larger than grain sizes of the second conductive feature at farther away from the bonding interface. The bonded first and second conductive features can include a first average grain size at a first region of the bonded first and second conductive features and a second average grain size at a second region of the bonded first and second conductive features larger than the first average grain size. For example, the first average size can be at least three times larger than the second average size. The second region can be a region at or near the bonding interface and the first region can be a region at or near a location farther away from the bonding interface. The first element can further include a third conductive feature below the first conductive feature. The third conductive feature can have a third average grain size. The third grain size can be smaller than an average grain size of the first conductive feature.

FIGS. 1A-2F illustrate schematic cross-sectional side views of a first element 1 and/or a second element 2 in various steps of methods of forming a bonded structure in accordance with various embodiments. FIG. 1A is a schematic cross-sectional side view of a structure that includes the first element 1 and the second element 2 in a step of a method of forming the bonded structure. In FIG. 1A, stress (e.g., mechanically induced biaxial tensile stress) can be applied on bonding surfaces of the first element 1 and the second element 2. The stress can be applied to the structure in an oven to simultaneously apply heat for annealing. FIGS. 1B-1E show steps of forming the structure of FIG. 1A. The method can include providing the first element 1 that has a first non-conductive region 10 and a first conductive feature 12. A bonding surface **12*a* of the first conductive feature 12 can be recessed relative to a bonding surface 10*a* of the first non-conductive region 10. The bonding surface 12*a* of the first conductive feature 12 can have a free surface. The first element 1 can also include an intervening layer 14 between the first non-conductive region 10 and the first conductive feature 12. In some embodiments, the intervening layer 14 can comprise a diffusion barrier layer. At FIGS. 1B and 2C**, no external pressure is applied.

Figure 1C:
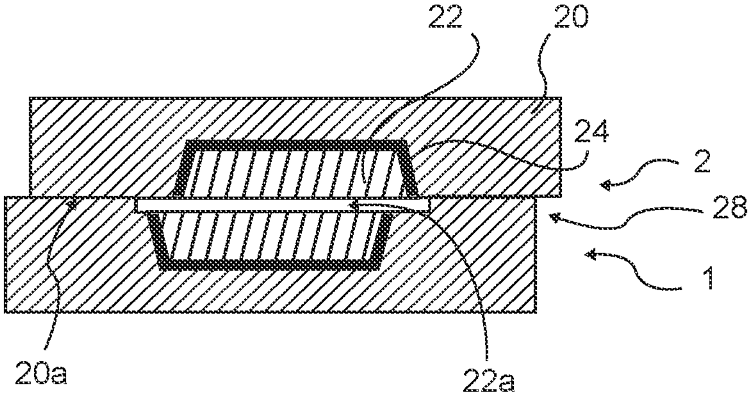
Figure 1D:
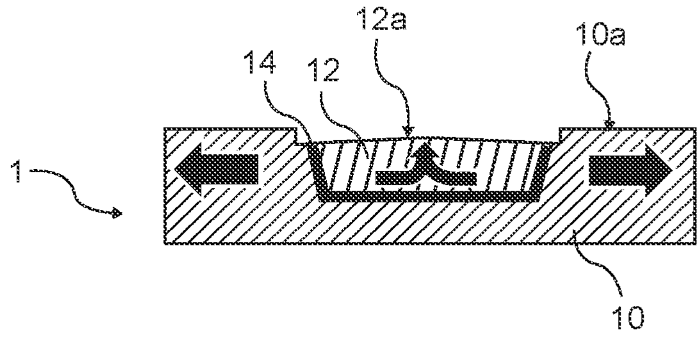

As shown in FIG. 1C, the method can include providing the second element 2 that has a second non-conductive region 20 and a second conductive feature 22. A bonding surface **22*a* of the second conductive feature 22 can be recessed relative to a bonding surface 20*a* of the second non-conductive region 20. The second element 2 can also include an intervening layer 24 between the second non-conductive region 20 and the second conductive feature 22. In some embodiments, the intervening layer 24 can comprise a diffusion barrier layer. The first and second non-conductive regions 10, 20 can be disposed over larger bulk portions (e.g., a carrier substrate, a handle substrate, or a semiconductor device portion, not illustrated) of the first and second elements 1, 2**.

Figure 1E:
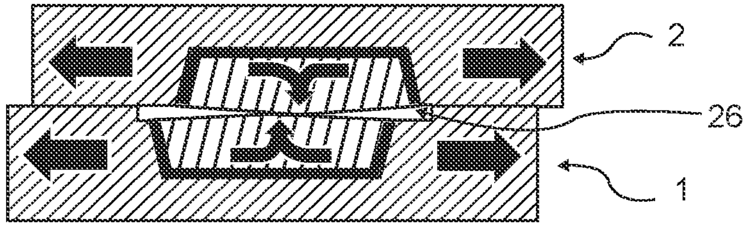

The first non-conductive region 10 and the second non-conductive region 20 can be bonded to one another. The first non-conductive region 10 and the second non-conductive region 20 can be directly bonded to one another without an intervening adhesive without application of external stress. For example, when the first element 1 and the second element 2 are brought into contact with each other, the first and second non-conductive regions 10, 20 can be directly bonded to one another without an intervening adhesive. The first and second non-conductive regions 10, 20 can be bonded without application of an external stress or pressure. As shown in FIGS. 1C and 2D, there can be a gap 26 between the bonding surface **12*a* of the first conductive feature 12 and the bonding surface 22*a* of the second conductive feature 22. As shown in FIGS. 1E and 2F, the stress applied to the bonding surfaces of the first element 1 and the second element 2 can enable the gap to be reduced. In some embodiments, the stress applied to the bonding surfaces of the first element 1 and the second element 2 can enable the gap 26 to be reduced so as to contact that the bonding surface 12*a* of the first conductive feature 12 and the bonding surface 22*a* of the second conductive feature 22. In some embodiments, the bonding surface 12*a* of the first conductive feature 12 and the bonding surface 22*a* of the second conductive feature 22 under such stress can enhance bonding to one another. In some embodiments, applying stress to the first non-conductive region 10 and/or the second non-conductive region 20, alone or in addition to applying stress to the first conductive feature 12 and/or the second conductive feature 22 can increase the bonding strength between the first conductive feature 12 and the second conductive feature 22**.

Figure 2A:
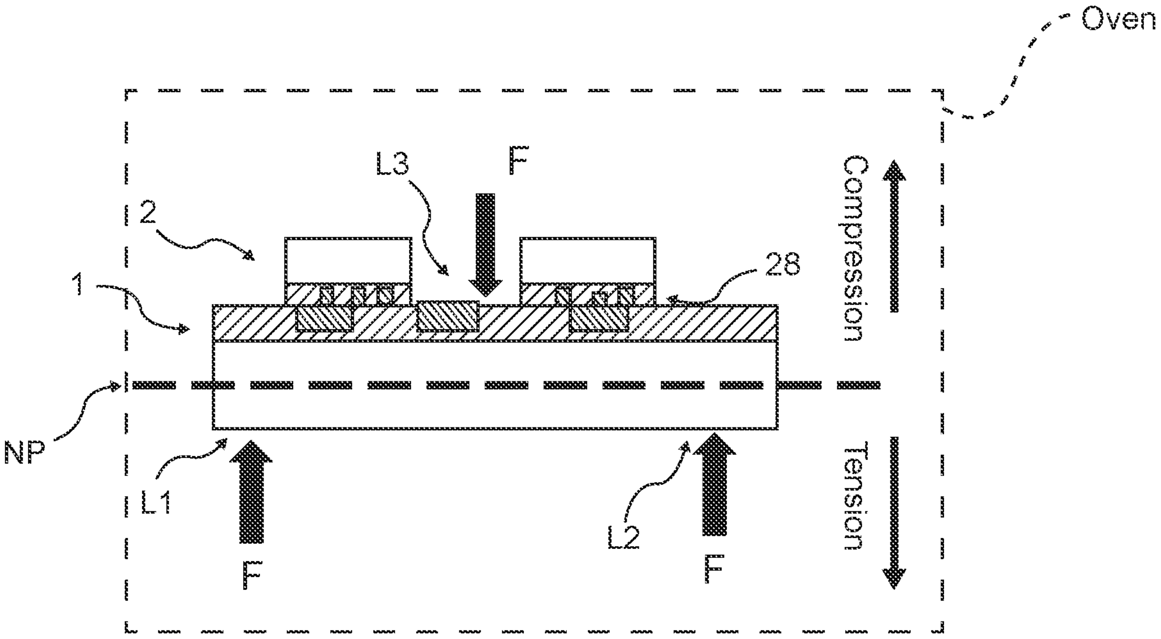
FIG. 2A is a schematic cross-sectional side view of the structure in a step of a method of forming a bonded structure, according to another embodiment.
Figure 2B:
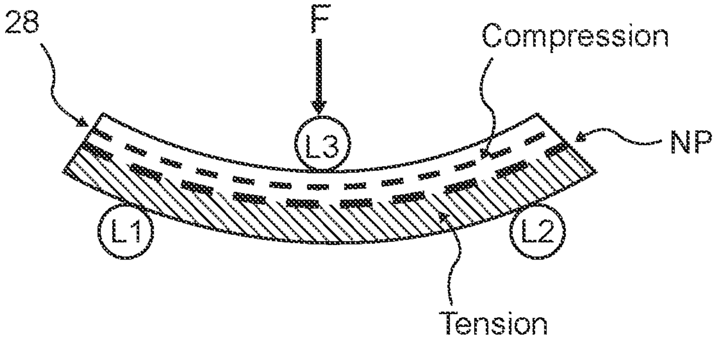
FIG. 2B shows another view of the structure of FIG. 2A.
Figure 2C:
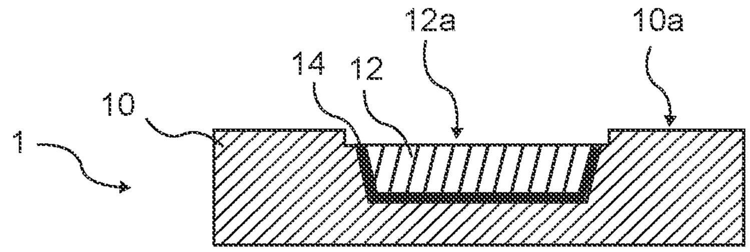
FIGS. 2C-2F show steps of forming the structure of FIG. 2A.
Figure 2D:
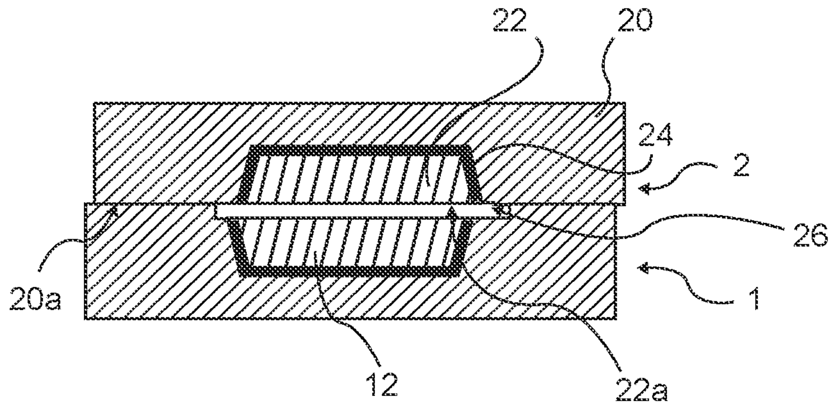
Figure 2E:
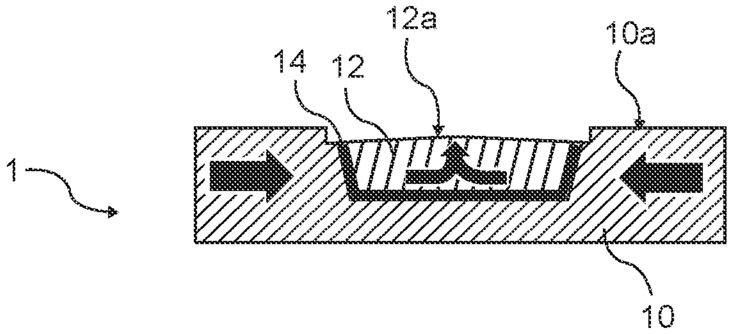
Figure 2F:
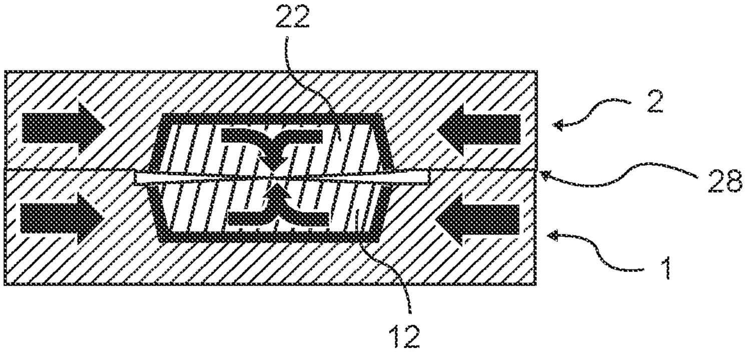

As shown, for example, in FIGS. 1A, 2A, and 2B, force can be applied to locations of the first and second elements 1, 2. Depending on the locations to which the force is applied, tensile or compression stress can be imparted to the first and second conductive features 12, 22. For example, in FIG. 1A, downward force or a distributed downward force is applied to a plurality of locations (first and second locations L1, L2) and upward force or distributed upward force is applied to one or more locations (a third location L3) laterally between the first and second locations L1, L2. In FIG. 1A, depending on their relative magnitudes, the applied forces can provide tensile (or compressive in another embodiment) stress to the bonding surface **12*a* of the first conductive feature 12 and the bonding surface 22*a* of the second conductive feature 22 (see FIGS. 1D and 1E). In some embodiments, depending at least in part on the relative thicknesses of the first and second elements 1, 2 and the relative magnitudes of the applied forces, for example when the first element 1 is thicker than the second element 2, the neutral plane NP of the applied forces may be located in the first element 1. The bonding surface 12*a* of the first conductive feature 12 and the bonding surface 22*a* of the second conductive feature 22 can define a bonding interface 28 after bonding. The tensile stress can significantly increase vacancies in the conductive features 12, 22 such that diffusion between the conductive features 12, 22 can be accelerated at a given temperature. The accelerated diffusion between the conductive features 12, 22 can enable the conductive features 12, 22 to bond with each other at a lower temperature than the conductive features 12, 22** without the application of stress.

For another example, in FIGS. 2A and 2B, upward force is applied to two locations (first and second locations L1, L2) and downward force is applied to another location (a third location L3) laterally between the first and second locations L1, L2. In some embodiments, the upward and downward forces may be distributed on the backsides of the first and second element 1, 2. The distributed forces may be uniform or nonuniform. For example, a known first distributed force maybe applied at portions or zone from the center to the mid portions of the back of an element (e.g., the first element 1), and a second known distributed force maybe applied at portions or zones between the mid portion to the periphery of the element. The second force may be higher than the first force to compensate for edge effects in the element. In some embodiments, forces at more than two zones may be applied. In FIGS. 2A and 2B, the applied forces can provide compression stress to the bonding surface 12*a* of the first conductive feature 12 and the bonding surface 22*a* of the second conductive feature 22 (see FIGS. 2E and 2F). The compression stress can bring the bonding surface 12*a* of the first conductive feature 12 and the bonding surface 22*a* of the second conductive feature 22 closer to each other. The compression stress applied to the conductive features 12, 22 can enable the conductive features 12, 22 to bond with each other at a lower temperature than the conductive features 12, 22 without the application of stress. As stated herein, in some embodiments, the applied compressive forces can be distributed on the first and second element 1 and 2. The distributed forces may be uniform or nonuniform. For example, a known first distributed force may be applied at portions or zones from the center to the mid portions of the back of an element, and a second known distributed force may be applied at portions or zones between the mid portion to the periphery of the element. The second force may be higher than the first force to compensate for edge effects in the element. In some embodiments, forces at more than two zones may be applied.

Figure 3:
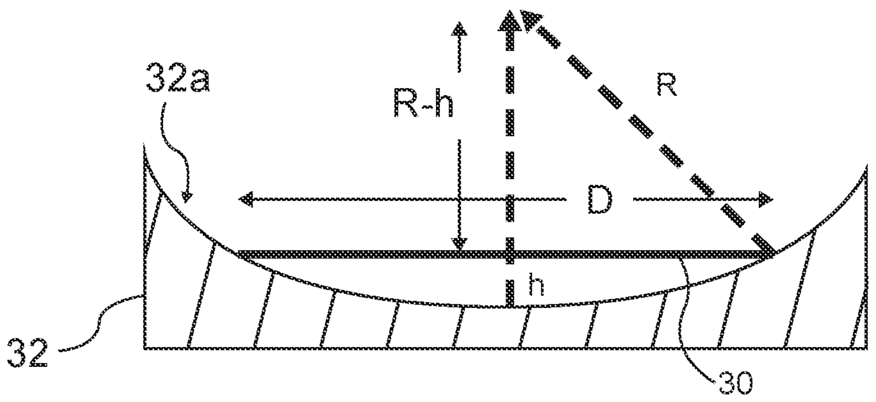
FIG. 3 shows a wafer positioned on a mold surface of a mold structure.
Figure 4:
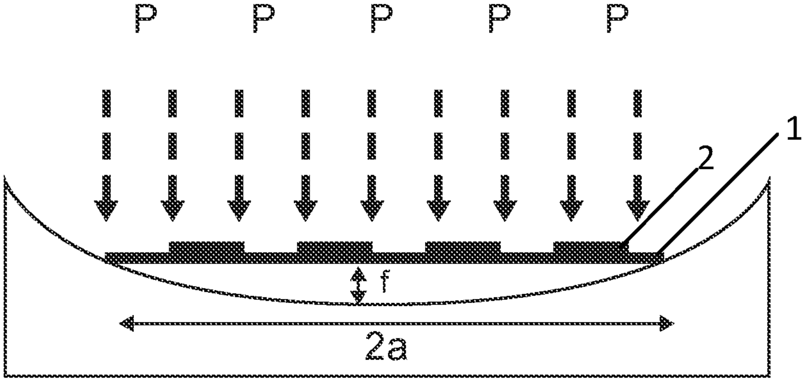
FIG. 4 illustrates a method of deforming a bonded element over a curved surface by the application a distributed pressure over the bonded elements.

FIGS. 3 and 4 describe theoretical relationships between the applied force and displacement caused by the applied force. FIG. 3 shows a wafer 30 positioned on a mold surface 32*a* of a mold structure 32. The wafer has a diameter D. Circle theory provides the following formulas in which, R represents the radius of the curvature of the mold surface 32*a*, and h represent the saggita of the curvature of the mold surface 32*a*.

$$R=D^2/8h+h/2;\ \text{when } h<<D, \text{ this reduces to } R\approx D^2/8h.$$

For example, for a reversible deformation of the wafer 30 over the mold structure (e.g., a curved mold), with a sagitta (h) of 200 μm, from circle theory, the radius of curvature of the mold surface can be approximated by $D^2/8h$. For a sagitta of 200 μm for 200 mm and 300 mm wafer, the radius of curvature for the mold surface 32*a* can be approximated to 25 m and 56.25 m respectively. The flexural rigidity of 200 mm or 300 mm wafer with the sagitta of 200 μm can be very small. In practice, because of the very large geometric aspect ratio (e.g., diameter of wafer/thickness of wafer>80) of wafer, the bonded elements may be treated as a membrane and not a thin plate. Membranes (bonded elements) can have a very small flexural rigidity and thus can barely sustain bending loads. Similarly, the bonded elements may not sustain compressive loads without wrinkling. In such instances, bonded elements can be supported over a convex or concave surface of known radius of curvature, so the bonded elements can sustain both tensile and compressive forces. The radius R of curvature for the mold structure 32 or die supporting surface may scale to any particular value.

FIG. 4 illustrates a method of deforming the bonded elements 1, 2 over a curved surface by the application of for example, a distributed pressure or load P over the bonded elements 1, 2 (e.g., a die to wafer (D2W) bonded structure). For an elastic deformation of a thin plate, such as when a plate deformation f divided by a plate thickness h (f/h) is less than 0.2, relationship between the plate thickness h, a bending stiffness or flexural rigidity D, pressure P, a radius of the die a, Young's modulus E, and Poissons ratio ν, can be expressed by the following equations:

$$D=Eh^3/12(1-\nu^2);\ f=Pa^4/64D.$$

As the thickness of the plate h becomes thinner and approaches a negligible thickness, the bending stiffness D approaches zero, as the thin plate transitions to a membrane for example.

Figure 5A:
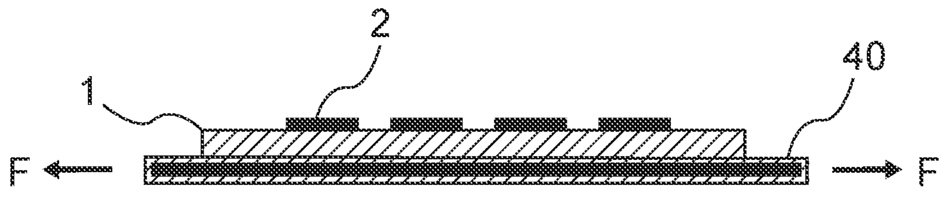
FIG. 5A is a schematic cross-sectional side view of bonded elements coupled to a stretch layer.
Figure 5B:
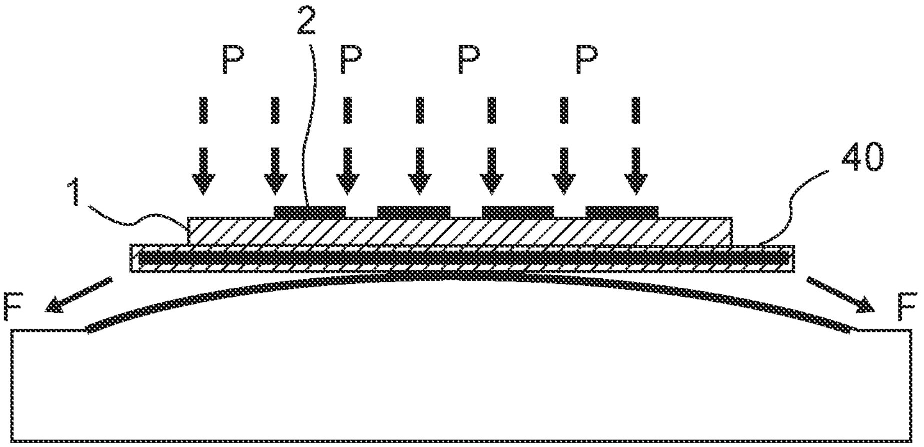
FIG. 5B is a schematic cross-sectional side view of the bonded elements and the stretch layer positioned over a concave surface.

As shown in FIGS. 5A and 5B, in some embodiments, bonded elements 1, 2 may be coupled to a stretch layer 40. A know tensile force can be applied, for example, biaxially to the bonded elements 1, 2 via the stretch layer 40. In some embodiments, the stretch layer 40 and the bonded elements 1, 2 can be annealed at a first temperature to bond the conductive features of the elements 1, 2. In some embodiments, the bonded elements 1, 2 may be stretched over a concave surface of known radius of curvature and additional compressive or hydrostatic force P applied to compress the stretched layer 40 and the bonded elements 1, 2 against the concave surface (see FIG. 5B). In this application, the bonded elements 1, 2 are stretched and compressed during an annealing process with a second temperature lower than the first temperature. In some embodiments, for example, instead of by a bladder, the applied hydrostatic force may comprise gas pressure applied via a shaped plate with a plurality of holes. In some embodiments, the shaped plate may have multiple zones with independently controlled pressure applied to the bonded elements 1, 2.

Figure 6:
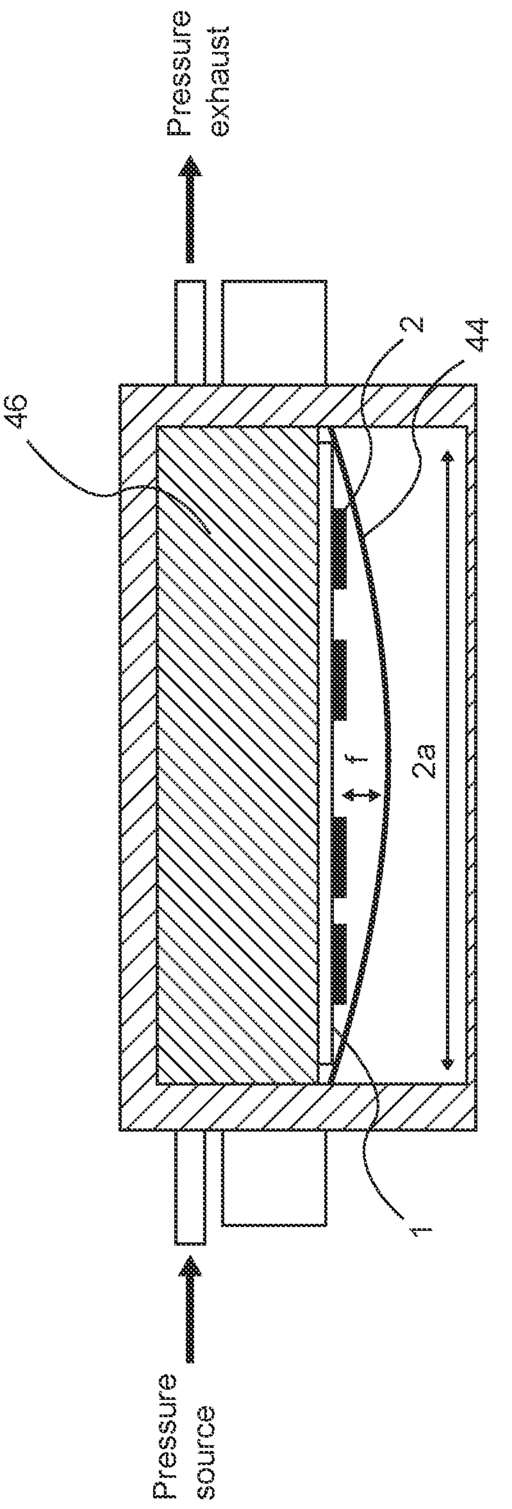
FIG. 6 is a schematic cross-sectional side view of an assembly of a first element and a second element that are disposed over a convex supporting surface according to an embodiment.

FIG. 6 is a schematic cross-sectional side view of an assembly of a first element 1 and a second element 2 that are disposed over a convex supporting surface 44 according to an embodiment. A conformable loading element, for example a bladder 46 can expand so as to deform the first and second elements 1, 2, bridging the sagitta f to conform to the curvature of the supporting surface 44 and impart stress to conductive features of the first and second elements 1, 2. The applied pressure P by the bladder 46 during the annealing step may range from 0.1 MPa to 100 MPa, 20 MPa to 1 GPa, 350 MPa to 1 GPa, 20 MPa to 500 MPa, 50 MPa to 400 MPa, 50 MPa to 100 MPa, 100 MPa to 250 MPa, 100 MPa to 350 MPa, 150 MPa to 300 MPa, or 175 MPa to 275 MPa. The applied pressure P from the bladder 46 should be adequate to enhance the bonding of the first and the second conductive features of the first and second elements 1, 2 without incorporating unwanted defects in the bonded element 1, 2. The unwanted defects may include cracks, delamination, crushing or chipping of elements, or fracture of any of the elements 1, 2. Also, the applied pressure P may be applied periodically. In some embodiments, the applied pressure P may be applied for 60 seconds and the pressure relieved for 3 seconds. In other embodiments, the pressure may be cycled between an upper pressure limit of Pmax and a lower pressure limit Pmin, such as 0.5 P MPa for example. The applied pressure P is transmitted to first and second conductive features of the bonded elements 1, 2 to reduce or bridge the recess between the conductive features. Bridging the recess can allow bonding to occur at a lower temperature compared to elements with unbridged recesses. Also, the induced creep on the conductive features of the first and second elements 1, 2 and the generated crystal defects, for example vacancies or dislocations created by the elastic or plastic deformation of the applied pressure P enhances the diffusion of the atoms of the conductive features of the bonded elements 1, 2.

Figure 7A:
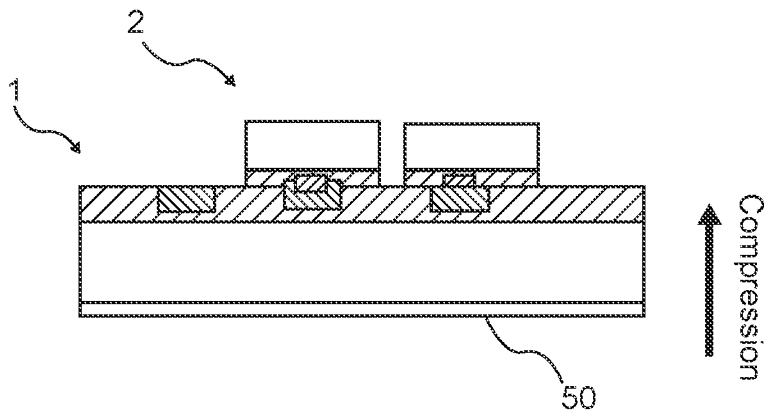
FIG. 7A is a schematic cross-sectional side view of bonded first and second elements coupled to a compressive or tensile layer, according to an embodiment.

FIG. 7A is a schematic cross-sectional side view of bonded elements 1, 2 coupled to a compressive or tensile layer 50, according to an embodiment. As shown in FIG. 7A, a compressive or tensile layer 50 can be disposed on a back side opposite the bonding surface of the first element 1 (or the second element 2 in some other embodiments). In some embodiments, the compressive or tensile layer 50 can be coated on the back side of the first element 1 (or the second element 2 in some other embodiments). The tensile layer 50 induces a compressive pressure or force between the bonded elements 1, 2 during the bonding operation at an elevated temperature, for example a temperature lower than 220° C. and even lower than 180° C. In some embodiments, after bonding steps are completed, the compressive or tensile layer 50 can be removed.

Figure 7B:
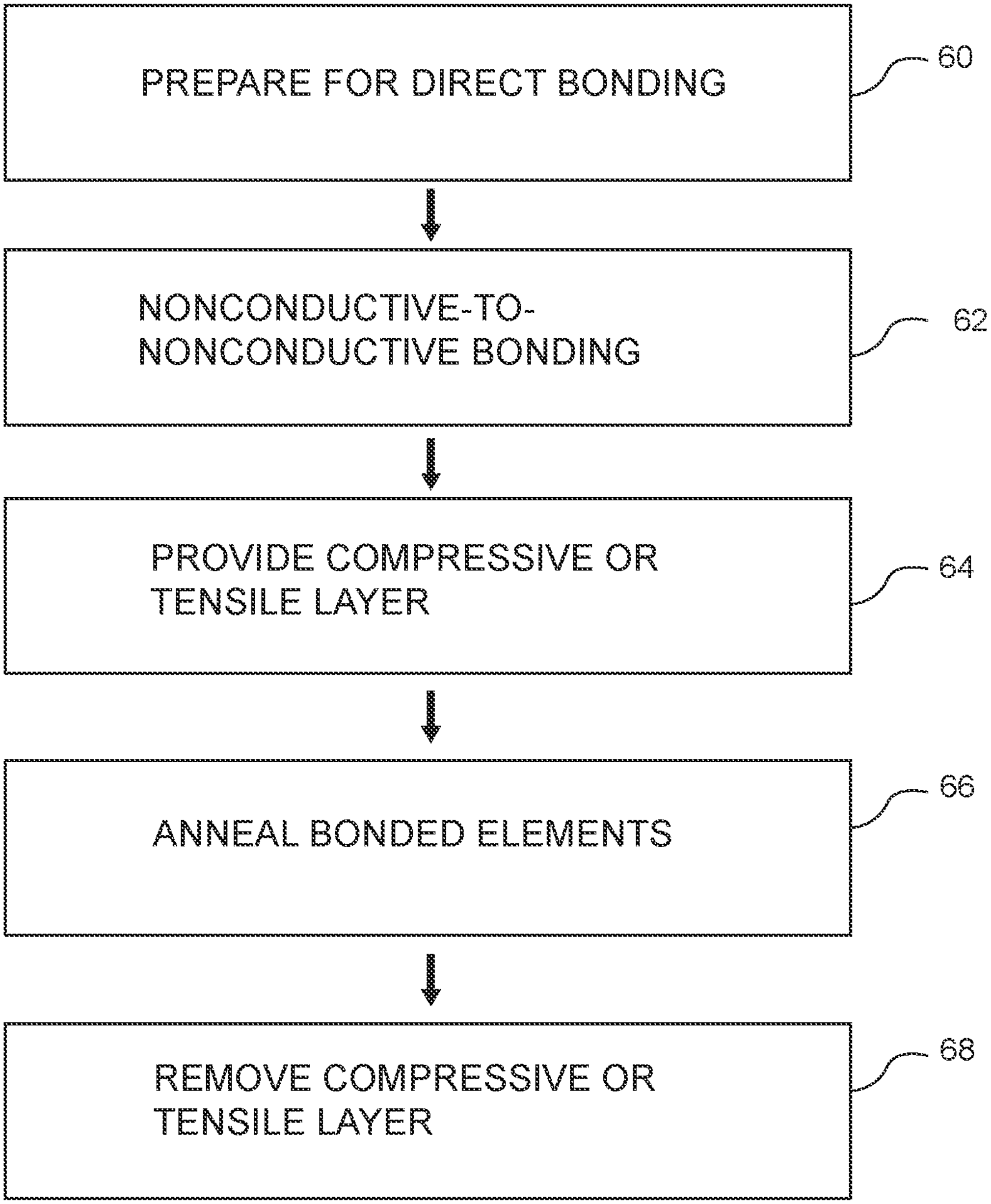
FIG. 7B is a flow chart of a method of bonding the first and second elements according to an embodiment.

FIG. 7B is a flow chart of a method of bonding the first and second elements 1, 2 according to an embodiment. At step 60, a bonding surface 10*a* of the first non-conductive region 10 of the first element 1 and/or a bonding surface 20*a* of the second non-conductive region 20 of the second element 2 can be prepared for direct bonding. For example, the bonding surfaces 10*a*, 20*a* can be cleaned and activated. At step 62, the bonding surfaces 10*a* and 10*b* can be bonded to one another by way of a dielectric-to-dielectric direct bonding. At step 64, a compressive or tensile layer 50 can be provided to the bonded elements 1, 2. At step 66, the bonded elements 1, 2 can be annealed to form a bonded structure (e.g., a directly hybrid bonded structure). At step 68, the compressive or tensile layer 50 can be removed from the bonded structure.

Figure 8A:
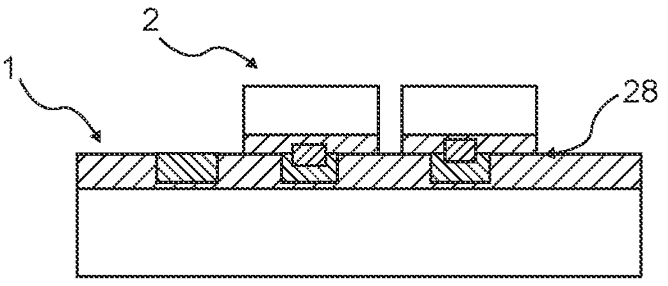
FIGS. 8A and 8B show schematic cross-sectional side views of bonded first and second elements during a bonding process.
Figure 8B:
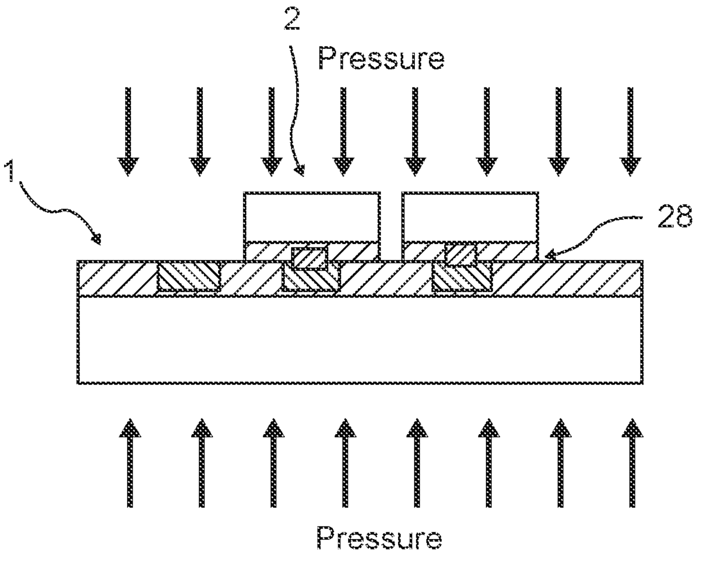
Figure 8C:
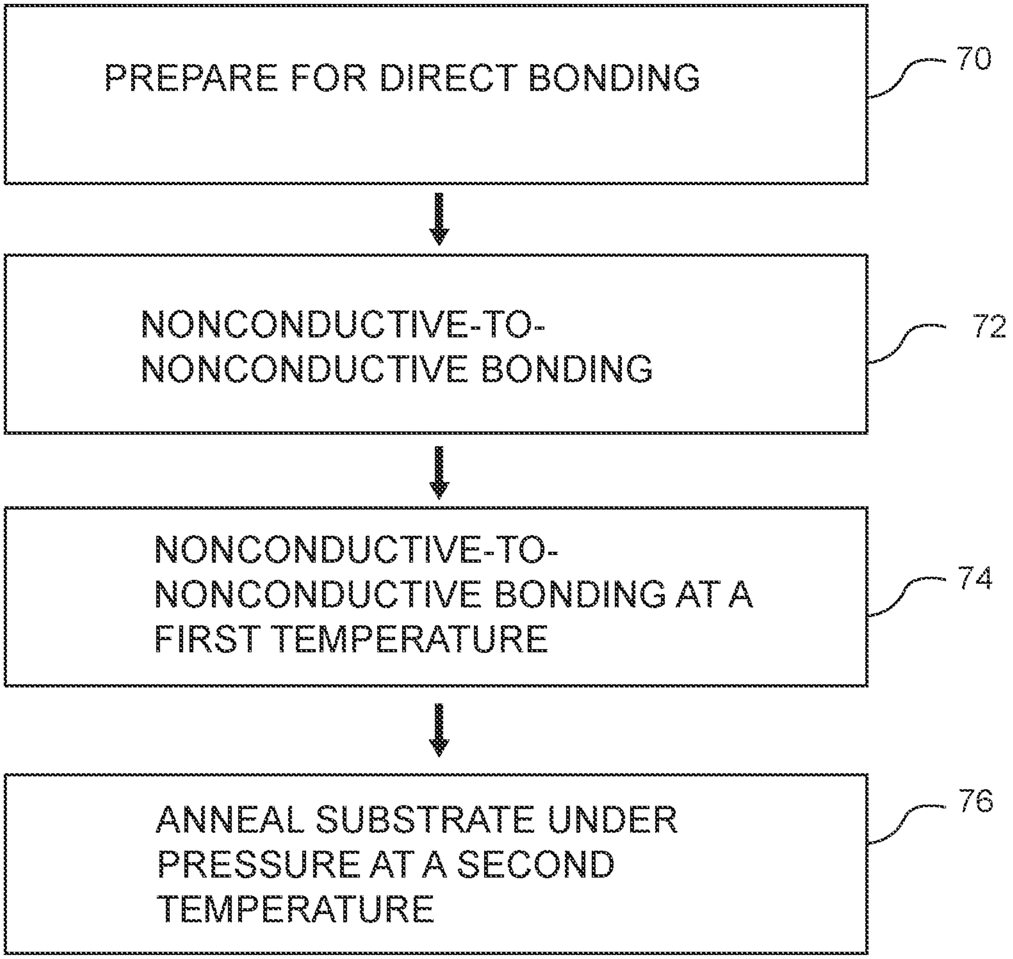
FIG. 8C is a flow chart of a method of bonding the first and second elements according to an embodiment.

FIGS. 8A and 8B show schematic cross-sectional side views of the bonded elements 1, 2. FIG. 8C is a flow chart of a method of bonding the first and second elements 1, 2 according to an embodiment. At step 70, a bonding surface 10*a* of the first non-conductive region 10 of the first element 1 and/or a bonding surface 20*a* of the second non-conductive region 20 of the second element 2 can be prepared for direct bonding. For example, the bonding surfaces 10*a*, 20*a* can be cleaned and activated. At step 72, the bonding surfaces 10*a* and 10*b* can be bonded to one another as shown in FIG. 8A. At step 74, the bonded elements 1, 2 can be heated with a low temperature (a first temperature), such as a temperature below 100° C. The bonding surfaces 10*a* and 10*b* can be bonded to one another at the first temperature. At step 76, as shown in FIG. 8B, a hydrostatic stress can be applied to the first element 1 and the second element 2. In such embodiments, the first element 1 and the second element 2 may not be deformed or curved. The hydrostatic stress can reduce the gap between opposing first and second conductive features prior to bonding, so as to reduce the distance between the first conductive feature and the second conductive feature as compared to the distance without imparting the hydrostatic stress. The hydrostatic stress can enhance the surface mobility of the first conductive feature and the second conductive feature at the bonding surfaces than without imparting the hydrostatic stress. The bonded elements 1, 2 can be heated (e.g., annealed) at a second temperature that is greater than the first temperature. For example, the second temperature can be in a range from to 100° C. to 250° C. The bonded elements 1, 2 can form a bonded structure (e.g., a directly hybrid bonded structure).

Figure 9A:
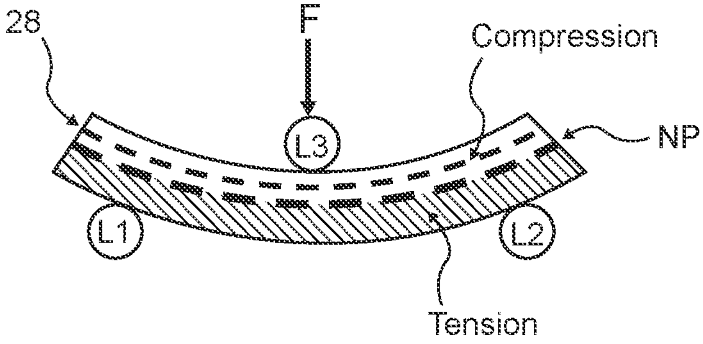
FIGS. 9A and 9B show examples of stress application methods.
Figure 9B:
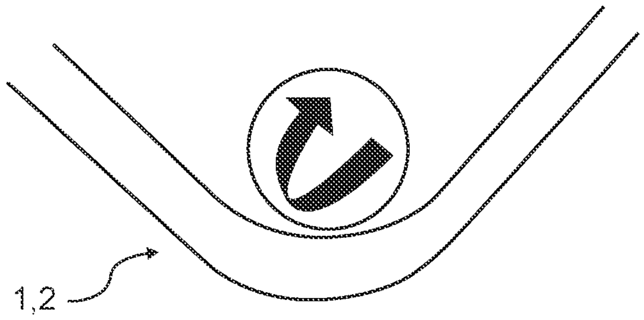

FIGS. 9A and 9B show examples of stress application methods. In some embodiments, as shown in FIGS. 9A and 9B, the stress can be applied by bending the bonded elements 1, 2. For example, the bonded elements 1, 2 can be bent by applying stress to three locations L1, L2, L3, as shown in FIG. 9A. In some embodiments, the bonded elements 1, 2 can be bent by applying stress to a location while moving the bonded elements 1, 2 along a length of the bonded elements 1, 2.

Figure 10:
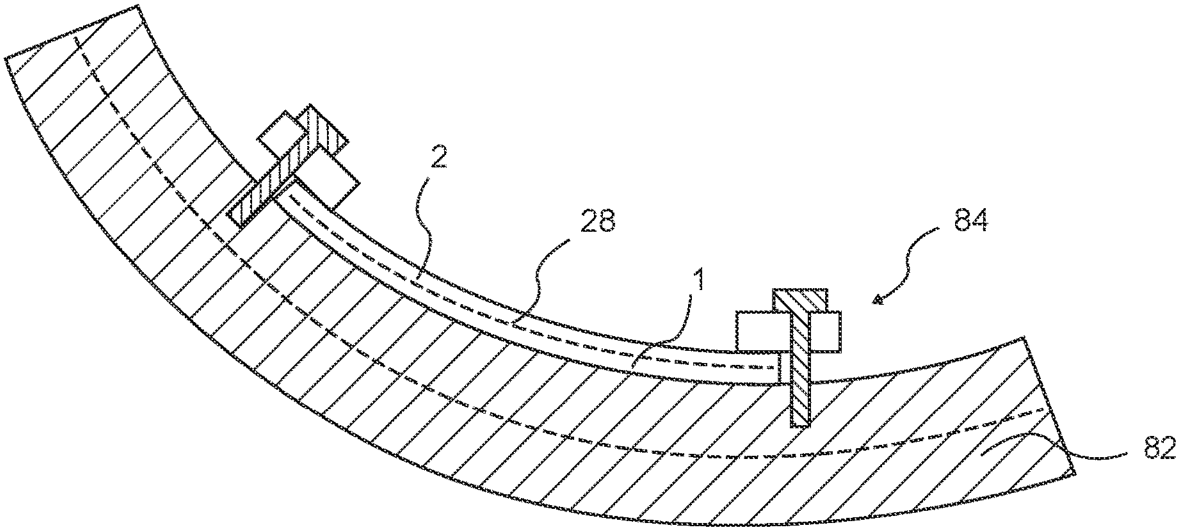
FIG. 10 shows the first and second elements coupled to a curved support structure.

FIG. 10 shows the first and second elements 1, 2 coupled to a curved support structure 82. In some embodiments, the curved support structure 82 can comprise a metal support structure. The curved support structure 82 can be attached to the first and second elements 1, 2 by way of clamps 84, for example. The support structure 82 can be straight initially, and the support structure 82 can be bent so as to bend the first and second elements 1, 2. The support structure 82 can be bent by mechanically bending the support structure 82. The support structure 82 can be bent by heating the support structure 82 and the first and second elements 1, 2. For example, the difference between the coefficient of thermal expansion of the support structure 82 and the coefficients of thermal expansion the first and/or the second elements 1, 2 can cause the support structure 82 to bend when heated. Bending the elements 1, 2 in the manner shown in FIG. 10 can impart stress to the first and second conductive features (e.g., contact pads) of the first and second elements 1, 2 as explained herein.

Figure 11A:
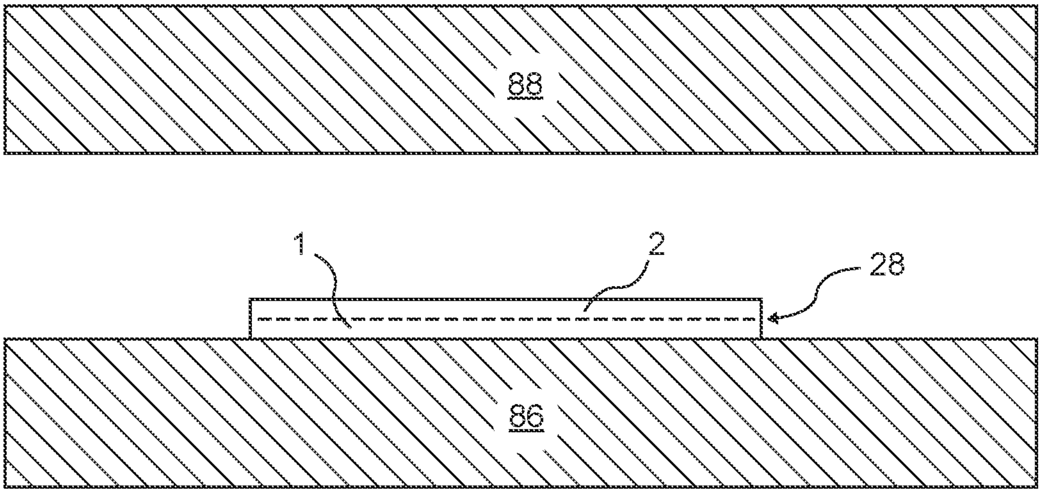
FIGS. 11A and 11B show a first support structure and a second support structure that are attached to the first and second elements.
Figure 11B:
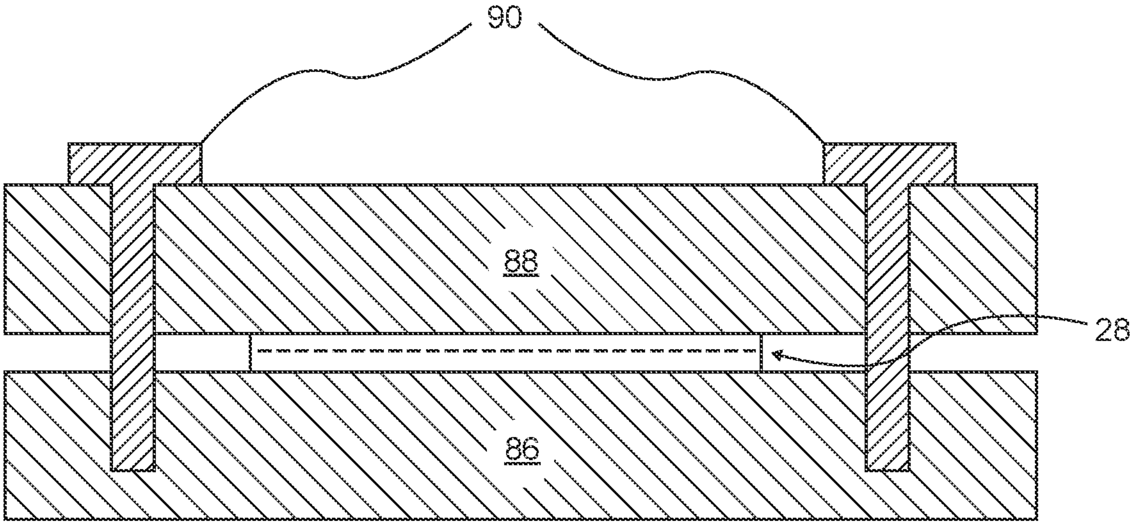

FIGS. 11A and 11B show a first support structure 86 (e.g., a bottom plate) and a second support structure 88 (e.g., a top plate) that can be attached to the first and second elements 1, 2. The first and second elements 1, 2 can be positioned between the first support structure 86 and the second support structure 88. The first support structure 86 and the second support structure 88 can be clamped to impart stress to the first and second elements 1, 2 by one or more clamps 90. For example, at FIG. 11A, prior to clamping the first and second support structures 86, 88, the first and second elements 1, 2 can be heated to expand, then, at FIG. 11B the first and second support structures 86, 88 can be cooled after clamping the first and second support structures 86, 88. In some embodiments, the first support structure 86 and/or the second support structure 88 can comprise a metal plate.

In one aspect, a method for forming a bonded structure is disclosed. The method can include providing a first element having a first non-conductive region and a first conductive feature, providing a second element having a second non-conductive region and a second conductive feature, bonding the first non-conductive region to the second non-conductive region, and imparting mechanical stress to at least one of the first conductive feature and the second conductive feature. The first conductive feature and the second conductive feature are spaced apart by a gap when bonding the first non-conductive region to the second non-conductive region, and imparting mechanical stress to the at least one of the first conductive feature and the second conductive feature reduces the gap between the first and second conductive features.

In one embodiment, the method further includes annealing the first and second elements while imparting the mechanical stress to the at least one of the first conductive feature and the second conductive feature to cause the first conductive feature to contact the second conductive feature. Prior to the imparting and the annealing, a bonding surface of the first conductive feature can be recessed by less than 30 nm relative to a bonding surface of the first non-conductive region. An annealing temperature for annealing the first conductive feature and the second conductive feature can be less than 250° C. The annealing temperature can be in a range of 100° C. to 250° C. The annealing temperature can be in a range of 100° C. to 200° C. The annealing temperature can be in a range of 100° C. to 150° C. The method can include coating a compressive layer on a back side of the first element opposite a bonding surface of the first element prior to the annealing.

In one embodiment, the method further including directly bonding the first non-conductive region to the second non-conductive region without an intervening adhesive. The method can further include directly bonding the first conductive feature to the second conductive feature without an intervening adhesive.

In one embodiment, a bonding surface of the first non-conductive region has a root-mean-square (rms) surface roughness of less than 2 nm.

In one embodiment, the imparting the mechanical stress to the at least one of the first conductive feature and the second conductive feature increases metallic surface mobility of the first conductive feature and/or the second conductive feature at a bonding interface.

In one embodiment, the imparting the mechanical stress to the at least one of the first conductive feature and the second conductive feature substantially closes the gap between the first conductive feature and the second conductive feature.

In one embodiment, the imparting the mechanical stress includes applying a tensile stress or a compression stress to the first conductive feature and/or the second conductive feature.

In one embodiment, the imparting the mechanical stress includes applying hydrostatic stress to the first element and the second element.

In one embodiment, the imparting the mechanical stress includes applying stress in a range of 0.1 MPa to 100 MPa.

In one embodiment, the imparting the mechanical stress includes attaching a curved support structure to the first element and the second element.

In one embodiment, the imparting the mechanical stress includes attaching a first support structure to the first element and attaching a second support structure to the second element such that the first and second elements are disposed between the first and second support structures, and clamping the first support structure to the second support structure.

In one embodiment, the imparting the mechanical stress includes deforming the first element and the second element. The deforming the first element and the second element can include applying a force to a first location of the first element in a first direction and applying force to a second location of the second element in a second direction opposite the first direction. The method can further include applying a force to a third location of the first element in the first direction so as to curve the first element and the second element. The second location can be located laterally between the first location and the third location. A middle ordinate of the curved first and second elements can be more than 10 μm. A middle ordinate of the curved first and second elements can be more than 1000 μm. The method can further include moving the first location, the second location, and the third location along a length of the first element and the second element while keeping relative locations between the first location, the second location, and the third location.

In one embodiment, the first element further includes a substrate portion that is thicker than a substrate portion of the second element.

In one aspect, a method for forming a bonded structure id disclosed. The method can include providing a first element having a first non-conductive region and a first conductive feature, providing a second element having a second non-conductive region and a second conductive feature, bonding the first non-conductive region to the second non-conductive region, imparting stress to at least one of the first conductive feature and the second conductive feature, and annealing the first and second elements while imparting the mechanical stress to the at least one of the first conductive feature and the second conductive feature. The first conductive feature and the second conductive feature spaced apart by a gap when bonding the first non-conductive region to the second non-conductive region. Annealing the first and second elements while imparting the mechanical stress causes the first conductive feature to contact the second conductive feature.

In one embodiment, the method further includes directly bonding the first non-conductive region to the second non-conductive region without an intervening adhesive and directly bonding the first conductive feature to the second conductive feature without an intervening adhesive.

In one embodiment, prior to the imparting and the annealing, a bonding surface of the first conductive feature is recessed by less than 30 nm relative to a bonding surface of the first non-conductive region.

In one embodiment, a bonding surface of the first non-conductive region has a root-mean-square (rms) surface roughness of less than 2 nm.

In one embodiment, the imparting the mechanical stress to the at least one of the first conductive feature and the second conductive feature increases metallic surface mobility of the first conductive feature and/or the second conductive feature at a bonding interface.

In one embodiment, the imparting the mechanical stress to the at least one of the first conductive feature and the second conductive feature substantially closes the gap between the first conductive feature and the second conductive feature.

In one embodiment, the imparting the mechanical stress includes applying a tensile stress or a compression stress to the first conductive feature and/or the second conductive feature.

In one embodiment, the imparting the mechanical stress includes applying hydrostatic stress to the first element and the second element.

In one embodiment, the imparting the mechanical stress includes applying stress in a range of 0.1 MPa to 100 MPa.

In one embodiment, the imparting the mechanical stress includes attaching a curved support structure to the first element and the second element.

In one embodiment, the imparting the mechanical stress includes attaching a first support structure to the first element and attaching a second support structure to the second element such that the first and second elements are disposed between the first and second support structures, and clamping the first support structure to the second support structure.

In one embodiment, the imparting the mechanical stress includes deforming the first element and the second element. The deforming the first element and the second element can include applying a force to a first location of the first element in a first direction and applying force to a second location of the second element in a second direction opposite the first direction. The method can further include applying a force to a third location of the first element in the first direction so as to curve the first element and the second element. The second location can be located laterally between the first location and the third location. A middle ordinate of the curved first and second elements can be more than 10 μm. A middle ordinate of the curved first and second elements can be more than 1000 μm. The method can further include moving the first location, the second location, and the third location along a length of the first element and the second element while keeping relative locations between the first location, the second location, and the third location.

In one embodiment, an annealing temperature for annealing the first conductive feature and the second conductive feature is less than 250° C. The annealing temperature can be in a range of 100° C. to 250° C. The annealing temperature can be in a range of 100° C. to 200° C. The annealing temperature can be in a range of 100° C. to 150° C.

In one embodiment, the method further includes coating a compressive layer on a back side of the first element opposite a bonding surface of the first element prior to the annealing.

In one embodiment, the first element further includes a substrate portion that is thicker than a substrate portion of the second element.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method for forming a bonded structure, the method comprising:

providing a first element having a first non-conductive region and a first conductive feature;

providing a second element having a second non-conductive region and a second conductive feature;

bonding the first non-conductive region to the second non-conductive region along a bonding interface, the first conductive feature and the second conductive feature spaced apart by a gap; and imparting mechanical stress having a component in a direction parallel to the bonding interface to at least one of the first conductive feature and the second conductive feature so as to reduce the gap between the first and second conductive features.

2. The method of claim 1, further comprising annealing the first and second elements while imparting the mechanical stress to at least one of the first conductive feature and the second conductive feature to cause the first conductive feature to contact the second conductive feature.

3. The method of claim 2, wherein prior to the imparting and the annealing, a bonding surface of the first conductive feature is recessed by less than 30 nm relative to a bonding surface of the first non-conductive region.

4. The method of claim 2, wherein an annealing temperature for annealing the first conductive feature and the second conductive feature is in a range of 100° C. to 250° C.

5. The method of claim 4, wherein the annealing temperature is in a range of 100° C. to 150° C.

6. The method of claim 2, further comprising coating a compressive layer on a back side of the first element opposite a bonding surface of the first element prior to the annealing.

7. The method of claim 1, further comprising directly bonding the first non-conductive region to the second non-conductive region without an intervening, and directly bonding the first conductive feature to the second conductive feature without an intervening adhesive.

8. The method of claim 1, wherein the imparting the mechanical stress to the at least one of the first conductive feature and the second conductive feature increases metallic surface mobility of the first conductive feature and/or the second conductive feature at the bonding interface, and substantially closes the gap between the first conductive feature and the second conductive feature.

9. The method of claim 1, wherein the imparting the mechanical stress comprises applying a tensile stress or a compression stress to the first conductive feature and/or the second conductive feature, or applying hydrostatic stress to the first element and the second element, wherein the imparting the mechanical stress comprises applying stress in a range of 0.1 MPa to 100 MPa.

10. The method of claim 1, wherein the imparting the mechanical stress comprises attaching a curved support structure to the first element and the second element, and deforming the first element and the second element.

11. The method of claim 10, wherein the deforming the first element and the second element comprises applying a first force to a first location of the first element in a first direction and applying a second force to a second location of the second element in a second direction opposite the first direction, and applying a third force to a third location of the first element in the first direction so as to curve the first element and the second element, wherein the second location is located laterally between the first location and the third location.

12. The method of claim 11, wherein a middle ordinate of the curved first and second elements is more than 10 μm.

13. The method of claim 12, wherein the middle ordinate of the curved first and second elements is more than 1000 μm.

14. A method for forming a bonded structure, the method comprising:

providing a first element having a first non-conductive region and a first conductive feature;

providing a second element having a second non-conductive region and a second conductive feature;

bonding the first non-conductive region to the second non-conductive region along a bonding interface, the first conductive feature and the second conductive feature spaced apart by a gap;

imparting mechanical stress having a component in a direction parallel to the bonding interface to at least one of the first conductive feature and the second conductive feature; and annealing the first and second elements while imparting the mechanical stress to at least one of the first conductive feature and the second conductive feature to cause the first conductive feature to contact the second conductive feature.

15. The method of claim 14, further comprising directly bonding the first non-conductive region to the second non-conductive region without an intervening adhesive and directly bonding the first conductive feature to the second conductive feature without an intervening adhesive, wherein prior to the imparting and the annealing, a bonding surface of the first conductive feature is recessed by less than 30 nm relative to a bonding surface of the first non-conductive region.

16. The method of claim 14, wherein the imparting the mechanical stress to at least one of the first conductive feature and the second conductive feature increases metallic surface mobility of the first conductive feature and/or the second conductive feature at the bonding interface.

17. The method of claim 14, wherein the imparting the mechanical stress comprises applying a tensile stress or a compression stress to the first conductive feature and/or the second conductive feature or applying hydrostatic stress to the first element and the second element.

18. The method of claim 14, wherein the imparting the mechanical stress comprises attaching a first support structure to the first element and attaching a second support structure to the second element such that the first and second elements are disposed between the first and second support structures, and clamping the first support structure to the second support structure.

19. The method of claim 14, wherein the imparting the mechanical stress comprises deforming the first element and the second element, and the deforming the first element and the second element comprises applying a first force to a first location of the first element in a first direction and applying a second force to a second location of the second element in a second direction opposite the first direction, and applying a third force to a third location of the first element in the first direction so as to curve the first element and the second element, wherein the second location is located laterally between the first location and the third location.

20. The method of claim 14, wherein an annealing temperature for annealing the first conductive feature and the second conductive feature is in a range of 100° C. to 250° C., wherein the first element further comprises a substrate portion that is thicker than a substrate portion of the second element.

* * * * *